(12) United States Patent
Sun

(10) Patent No.: US 7,599,182 B2
(45) Date of Patent: Oct. 6, 2009

(54) HEAT DISSIPATION DEVICE

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 58 days.

(21) Appl. No.: 11/869,753

(22) Filed: Oct. 10, 2007

(65) Prior Publication Data

US 2008/0123289 A1 May 29, 2008

(30) Foreign Application Priority Data

Nov. 23, 2006 (CN) .................... 2006 1 0201132

(51) Int. Cl.
*H05K 7/20* (2006.01)

(52) U.S. Cl. .................. 361/695; 361/690; 361/694; 361/697; 361/719; 361/720; 361/721; 165/80.3; 174/16.1; 174/16.3

(58) Field of Classification Search .......... None
See application file for complete search history.

(56) References Cited

U.S. PATENT DOCUMENTS

| 5,763,950 | A | 6/1998 | Fujisaki et al. | |
|---|---|---|---|---|
| 6,364,009 | B1 * | 4/2002 | MacManus et al. | 165/185 |
| 6,778,390 | B2 * | 8/2004 | Michael | 361/695 |
| 7,120,018 | B2 | 10/2006 | Shen et al. | |
| 7,382,616 | B2 * | 6/2008 | Stefanoski | 361/698 |
| 7,397,665 | B2 * | 7/2008 | Yuval | 361/719 |

* cited by examiner

*Primary Examiner*—Boris L Chervinsky
(74) *Attorney, Agent, or Firm*—Frank R. Niranjan

(57) ABSTRACT

An exemplary heat dissipation device is provided for removing heat from a first electronic element and a second electronic element attached to a circuit board. The first electronic element is arranged at a side of the second electronic element. The heat dissipation device includes a heat sink attached to the CPU, a fan attached to the heat sink, and an air guide member attached to the second electronic element. The air guide member includes a guiding portion to guide air from the fan to the second electronic element.

18 Claims, 5 Drawing Sheets

HEAT DISSIPATION DEVICE

BACKGROUND

1. Field of the Invention

The present invention relates to a heat dissipation device.

2. Description of Related Art

During operation of an electronic device, a large amount of heat is often produced by electronic elements therein, such as by a central processing unit (CPU), and memory cards in a computer. Generally, the heat is quickly removed from the CPU to prevent unstable operation or damage to the CPU. Typically, a heat sink is attached to an outer surface of the CPU to absorb the heat from the CPU. The heat absorbed by the heat sink is then dissipated to the ambient air via a fan attached on the heat sink. However, airflow generated by the fan of the CPU does not directly flow to the memory cards, therefore, function of the fan of the CPU is not fully utilized.

What is desired, therefore, is to provide a heat dissipation device which can efficiently dissipate heat for electronic elements in an electronic device.

SUMMARY

A heat dissipation device of one embodiment is for removing heat from a first electronic element and a second electronic element attached to a circuit board. The first electronic element is arranged at a side of the second electronic element. The heat dissipation device includes a heat sink attached to the CPU, a fan attached to the heat sink, and an air guide member attached to the second electronic element. The air guide member includes a guiding portion to guide air from the fan to the second element.

Other advantages and novel features of the present invention will become more apparent from the following detailed description of preferred embodiments when taken in conjunction with the accompanying drawings, in which:

DETAILED DESCRIPTION

Figure 1:
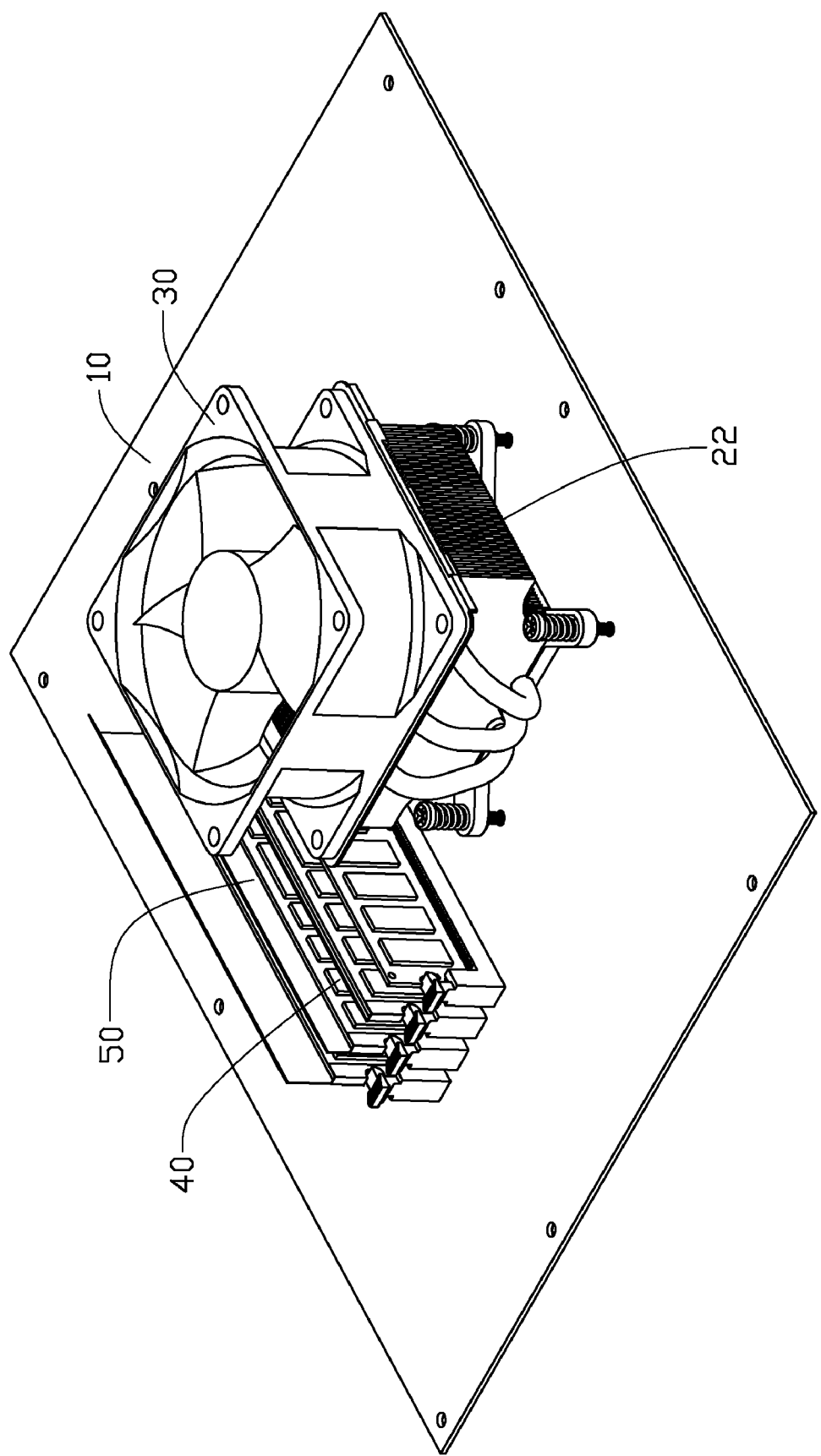
FIG. 1 is an assembled, isometric view of a heat dissipation device according to a first embodiment of the present invention, together with a circuit board, a CPU, and a plurality of memory cards.
Figure 2:
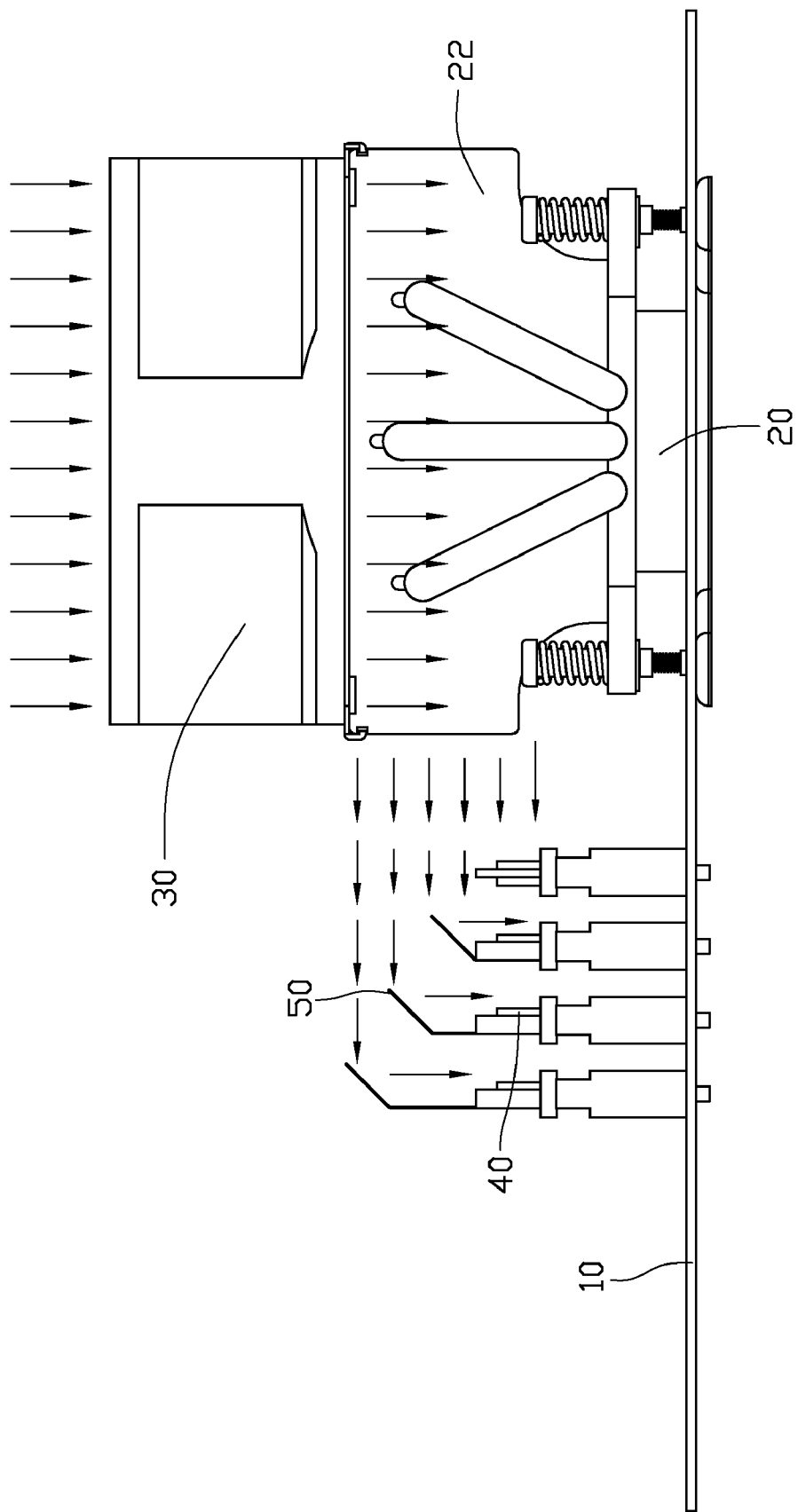
FIG. 2 is a side planar view of the heat dissipation device of FIG. 1.

Referring to FIGS. 1 and 2, in a first embodiment of the invention, a heat dissipation device is provided for removing heat from a CPU 20 and a plurality of memory cards 40 attached to a circuit board 10. The heat dissipation device includes a heat sink 22 attached to a top of the CPU 20, a fan 30 attached to a top of the heat sink 22, and a plurality of air guide members 50 attached to the memory cards 40 respectively. The heat sink 22 includes a plurality of parallel fins, and a plurality of airflow passages defined between the fins. The memory cards 40 are disposed in alignment with, but perpendicular to the air flow passages.

Figure 3:
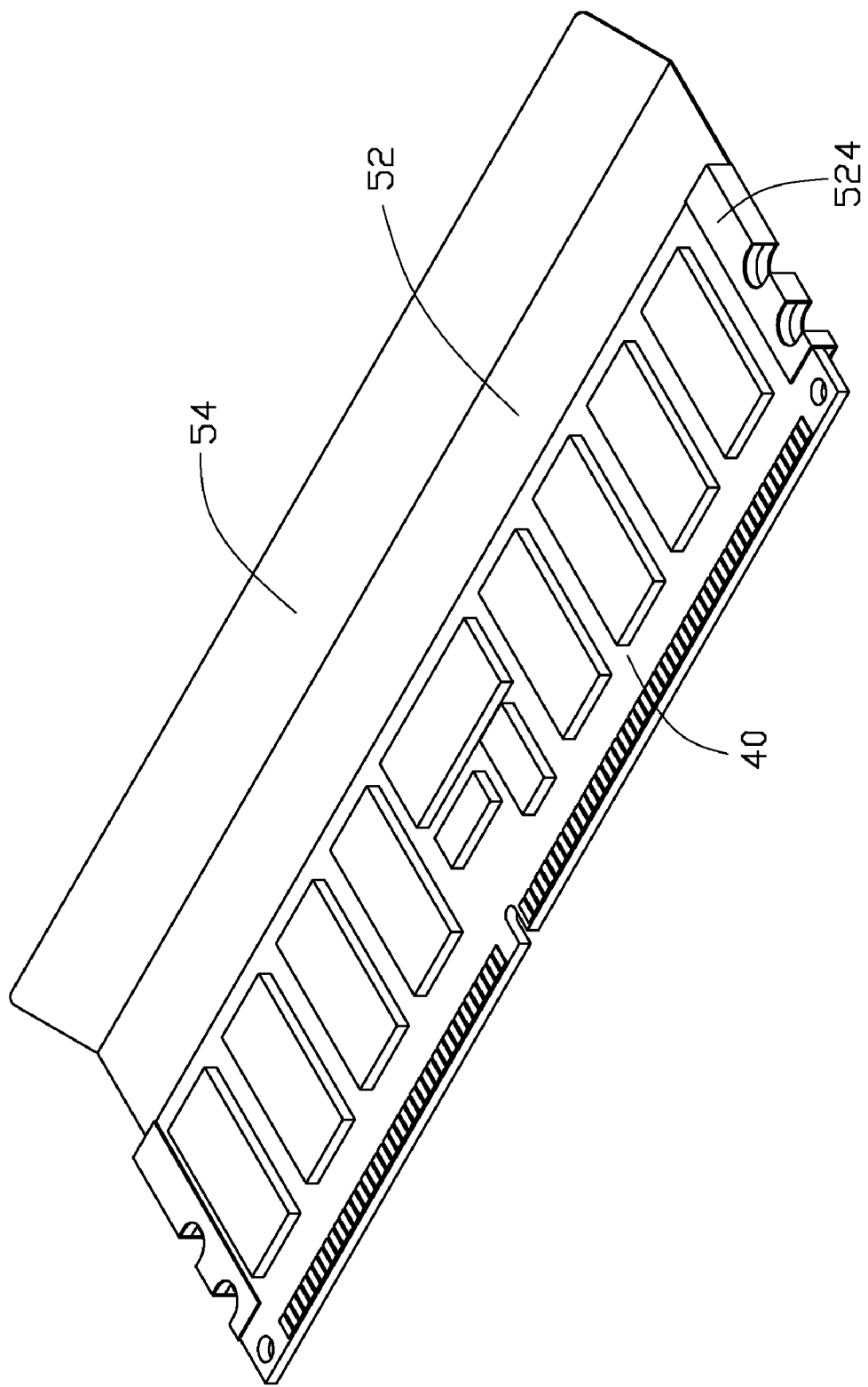
FIG. 3 is an enlarged isometric view of one memory card and one air guide member of the heat dissipation device of FIG. 1.
Figure 4:
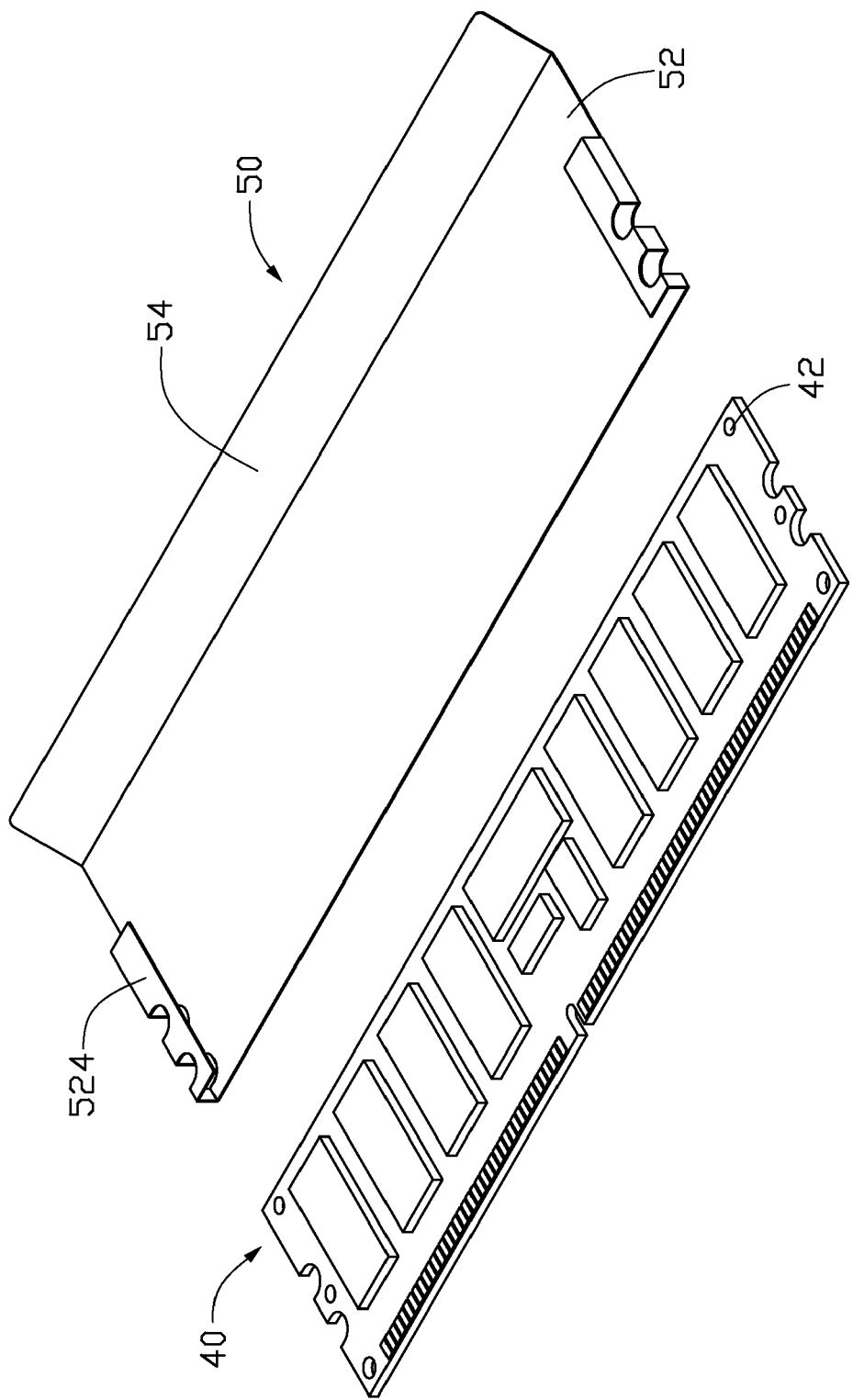
FIG. 4 is an exploded of FIG. 3.

Referring to FIGS. 3 and 4, each of the air guide members 50 includes a main portion 52, and a guiding portion 54 extending slantingly from a top edge of the main portion 52. The main portion 52 includes a pair of folded flanges 524 extending from opposite side edges thereof. The folded flanges 524 and the main portion 52 cooperatively define a retaining space to retain one memory card 40.

The memory cards 40 are arranged in lines on the circuit board 10 beside the CPU 20. The higher the air guide member 50 is, the farther the corresponding memory card 40 is away from the CPU 20.

Referring to FIG. 2, most of the airflow from the fan 30 is directed to a center of the heat sink 22, the rest is directed outward by the passages of the heat sink 22 and guided to the memory cards 40 by the air guide members 50. Thus, the airflow from the fan 30 can be directed to the memory cards 40 and aid in dissipating heat from the memory cards 40.

Figure 5:
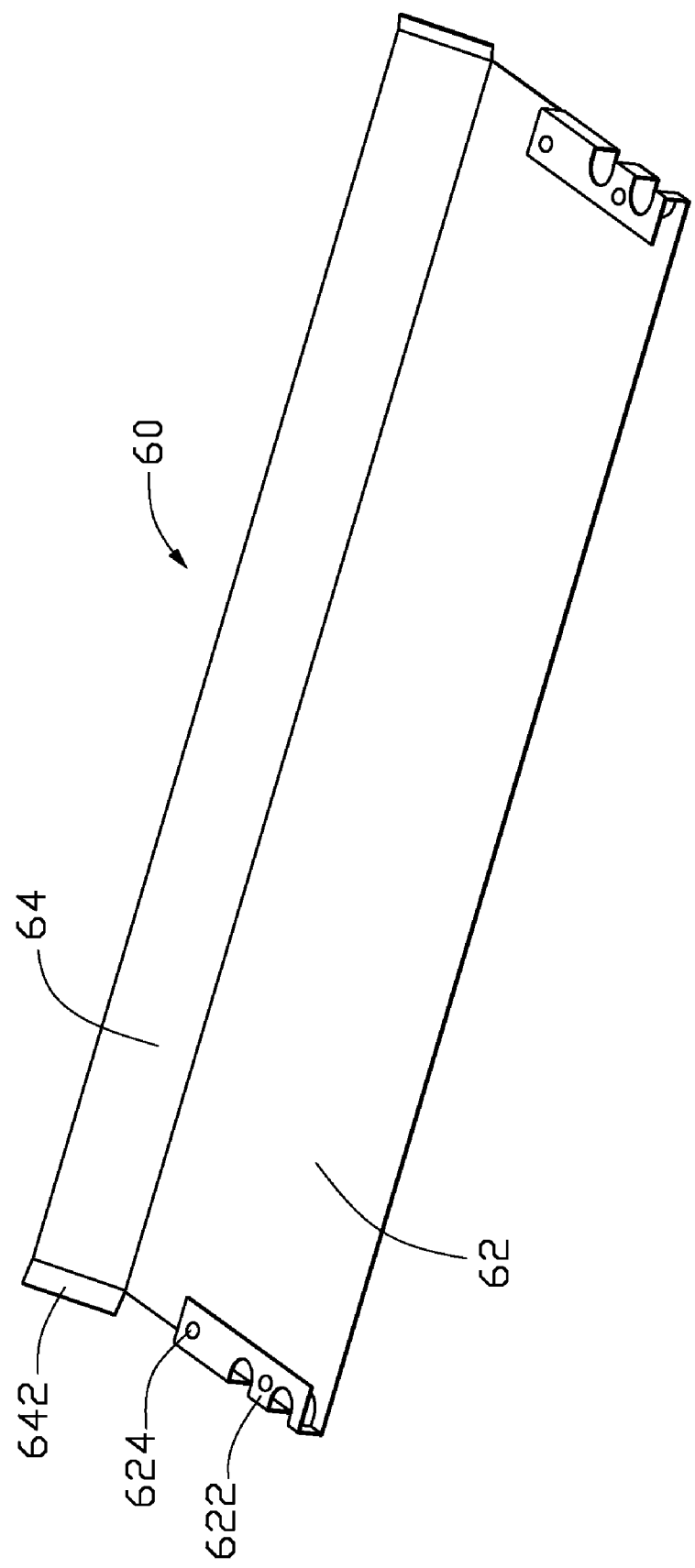
FIG. 5 is an enlarged isometric view of an air guide member of a heat dissipation device according to a second embodiment of the present invention.

Referring to FIG. 5, in a second embodiment of the invention, a heat dissipation device includes a plurality of air guide members 60 configured to be attached to tops of the memory cards 40. The air guide members 60 have similar construction and function as the air guide members 50 in the first embodiment. Each of the air guide members 60 includes a main portion 62, and a guiding portion 64 extending slantingly from a top edge of the main portion 62. The main portion 62 includes a pair of folded flanges 622 extending from opposite side edges thereof. The folded flanges 622 and the main portion 62 cooperatively define a retaining space to retain one memory card 40. The folded flanges 622 include a plurality of protrusions 624 extending downward toward the main portion 62 configured to engage in dents 42 of the memory card 40 (see FIG. 4). The guiding portion 64 comprises a pair of tabs 642 extending slantingly outward from opposite side edges thereof, further guiding air blowing from the fan 30 to the corresponding memory card 40.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A heat dissipation device for removing heat from a first electronic element and a second electronic element attached to a circuit board, the first electronic element being disposed adjacent the second electronic element, the second electronic element comprising a first surface facing the first electric element, and a second surface opposite to the first surface, the heat dissipation device comprising:

a heat sink attached to the first electronic element, the heat sink comprising an air outlet;

a fan attached to the heat sink and generating an airflow directed out from the air outlet; and an air guide member attached to and abutting against the second surface of the second electronic element and facing the air outlet of the heat sink, the air guide member comprising a guiding portion changing a direction of the airflow from a first direction perpendicular to the first surface of the second electronic element, to a second direction along the first surface.

2. The heat dissipation device as described in claim 1, wherein the air guide member comprises a main portion attached to the second surface in parallel, the guiding portion slantingly extending from a top edge of the main portion towards the first electronic element.

3. The heat dissipation device as described in claim 2, wherein the air guide member further comprises a pair of folded flanges respectively extending from opposite sides of the main portion, and engaging with the second electronic element.

4. The heat dissipation assembly as described in claim 1, wherein the first direction is substantially perpendicular to the circuit board, the second direction is substantially perpendicular to the circuit board.

5. The heat dissipation as described in claim 1, wherein the guiding portion guides the air flow to flow through the first surface of the second electronic element.

6. A heat dissipation assembly comprising:
a circuit board comprising a CPU, and a plurality of memory cards located at a side of the CPU, the memory cards extending upright from the circuit board, with bottoms of the memory cards connected to the circuit board;
a heat sink attached to a top of the CPU and comprising a plurality of fins and a plurality of airflow passages defined between adjacent fins, the passages directed toward the memory cards;
a fan attached to a top of the heat sink, and generating an airflow, the airflow being directed to the heat sink and directed outward by the passages of the heat sink; and
a plurality of air guide members respectively attached to tops of the memory cards and each of the guide members comprising a guiding portion guiding the airflow directed out from the passages to flow from the top of the corresponding memory card to the bottom of the corresponding memory card.

7. The heat dissipation assembly as described in claim 6, wherein each of the air guide members comprises a main portion connected to the second electronic element, the guiding portion slantingly extends out from an end edge of the main portion, and is slantwise related to the circuit board and an extending direction of the heat sink.

8. The heat dissipation assembly as described in claim 7, wherein each of the air guide members further comprises a pair of folded flanges extending from opposite sides of the main portion, and the folded flanges and the main portion sandwich the corresponding memory card therebetween.

9. The heat dissipation assembly as described in claim 6, wherein the memory cards are substantially perpendicular to the passages of the heat sink, the farther the memory card is away from the CPU, the bigger the air guide member is, to make sure the airflow can be guided to all of the memory cards by the plurality of the air guide members.

10. The heat dissipation assembly as described in claim 8, wherein the folded flanges each comprise at least one protrusion extending toward the main portion configured to engage in at least one dent of the corresponding memory card.

11. The heat dissipation assembly as described in claim 8, wherein the guiding portion comprises a pair of tabs extending slantingly outward from opposite side edges thereof, configured for further guiding airflow blowing from the fan to the corresponding memory card.

12. A heat dissipation assembly comprising:
a circuit board comprising an electronic component, and a plurality of parallel memory cards located at a side of the electronic component;
a heat sink attached to a top of the electronic component and comprising a plurality of parallel fins with parallel airflow passages defined between every two adjacent thereof, the passages directed toward the memory cards;
a fan attached to the heat sink and generating a airflow; and
a plurality of air guide members respectively attached to tops of the memory cards and each of the air guide members comprising a guiding portion arranged slanted relative to the passages and changing the direction of airflow from a first direction parallel with the passages of the heat sink to a second direction towards the circuit board.

13. The heat dissipation assembly as described in claim 12, wherein each of the air guide members comprises a main portion attached to the corresponding memory card, the main portion being perpendicular to the passages, the guiding portion slantingly extending from an edge of the main portion.

14. The heat dissipation assembly as described in claim 13, wherein each of the air guide members further comprises a pair of flanges folded from opposite sides of the main portion, the folded flanges and the main portion sandwich the corresponding memory card therebetween.

15. The heat dissipation assembly as described in claim 13, wherein the memory cards substantially perpendicularly faces the passages of the heat sink, the farther the memory card is away from the electronic component, the higher the main body of the air guide member relative to the circuit board is, to make sure the airflow can be guided to all of the memory cards by the plurality of the air guide members.

16. The heat dissipation assembly as described in claim 13, wherein the folded flanges each comprise at least one protrusion extending toward the main portion configured to engage in at least one dent of the corresponding memory card.

17. The heat dissipation assembly as described in claim 13, wherein the guiding portion comprises a pair of tabs extending slantingly from opposite side edges thereof, configured for further guiding airflow blowing from the fan to the corresponding memory card.

18. The heat dissipation assembly as described in claim 12, wherein the first direction is substantially parallel with the circuit board, the second direction is substantially perpendicular to the circuit board.

* * * * *